United States Patent
Hasegawa et al.

(10) Patent No.: US 9,011,985 B2
(45) Date of Patent: Apr. 21, 2015

(54) METHOD OF MANUFACTURE OF MULTILAYER FILM

(75) Inventors: Akira Hasegawa, Tsukuba (JP); Toshiya Kuroda, Tsukuba (JP); Takashi Sanada, Ichihara (JP)

(73) Assignee: Sumitomo Chemical Company, Limited, Tokyo (JP)

(*) Notice: Subject to any disclaimer, the term of this patent is extended or adjusted under 35 U.S.C. 154(b) by 0 days.

(21) Appl. No.: 13/503,806

(22) PCT Filed: Oct. 26, 2010

(86) PCT No.: PCT/JP2010/069394
§ 371 (c)(1),
(2), (4) Date: Jul. 10, 2012

(87) PCT Pub. No.: WO2011/052764
PCT Pub. Date: May 5, 2011

(65) Prior Publication Data
US 2012/0269988 A1 Oct. 25, 2012

(30) Foreign Application Priority Data
Oct. 30, 2009 (JP) ................ P2009-250310

(51) Int. Cl.
*H05H 1/24* (2006.01)
*C23C 16/50* (2006.01)
(Continued)

(52) U.S. Cl.
CPC ............. *C23C 14/086* (2013.01); *C23C 14/562* (2013.01); *H01L 51/0097* (2013.01); *H01L 51/5253* (2013.01); *C23C 16/401* (2013.01); *C23C 16/503* (2013.01); *C23C 16/545* (2013.01); *Y02E 10/549* (2013.01); *B32B 2307/202* (2013.01); *B32B 2307/412* (2013.01);
(Continued)

(58) Field of Classification Search
USPC ............ 427/249.15, 250, 255.29, 255.7, 569, 427/577, 578, 579
See application file for complete search history.

(56) References Cited

U.S. PATENT DOCUMENTS

| 5,013,416 A * | 5/1991 | Murayama et al. ........... 427/525 |
| 2005/0089648 A1* | 4/2005 | Yamazaki et al. ............ 427/569 |

(Continued)

FOREIGN PATENT DOCUMENTS

| CN | 101228217 A | 7/2008 |
| EP | 1921180 A1 * | 5/2008 |

(Continued)

OTHER PUBLICATIONS

Leterrier, Y., et al., "Mechanical integrity of transparent conductive oxide films for flexible polymer-based displays." Thin Solid Films 460 (2004) 156-166.*

(Continued)

*Primary Examiner* — Bret Chen
(74) *Attorney, Agent, or Firm* — Sughrue Mion, PLLC

(57) ABSTRACT

A process for producing a multilayer film which, even when bent, is less apt to decrease in barrier property or electrical conductivity. The process comprises forming a barrier film and a transparent conductive film on a resin film to produce a multilayer film. The barrier film is formed by a plasma enhanced CVD method which uses electric discharge between rolls. The transparent conductive film is preferably formed by physical vapor deposition. The resin film preferably is a polyester resin film or a polyolefin resin film.

10 Claims, 1 Drawing Sheet

(51) Int. Cl.

| | | |
|---|---|---|
| *C23C 14/08* | (2006.01) | |
| *C23C 14/56* | (2006.01) | |
| *H01L 51/00* | (2006.01) | |
| *H01L 51/52* | (2006.01) | |
| *C23C 16/40* | (2006.01) | |
| *C23C 16/503* | (2006.01) | |
| *C23C 16/54* | (2006.01) | |

(52) U.S. Cl.
CPC ..... *B32B 2307/724* (2013.01); *B32B 2307/726* (2013.01); *B32B 2457/00* (2013.01)
USPC .......................... 427/577; 427/578; 427/579

(56) References Cited

U.S. PATENT DOCUMENTS

| | | | |
|---|---|---|---|
| 2007/0020451 A1 | 1/2007 | Padiyath et al. | |
| 2007/0180924 A1* | 8/2007 | Warren et al. | 73/780 |
| 2007/0295385 A1* | 12/2007 | Sheats et al. | 136/251 |
| 2008/0226924 A1* | 9/2008 | Okubo et al. | 428/426 |
| 2009/0000517 A1* | 1/2009 | Kishimoto | 106/286.4 |
| 2010/0098955 A1 | 4/2010 | Sakakura | |
| 2012/0040107 A1 | 2/2012 | Hasegawa et al. | |

FOREIGN PATENT DOCUMENTS

| | | |
|---|---|---|
| JP | 0699536 A | 4/1994 |
| JP | 2003-294945 A | 10/2003 |
| JP | 2003320609 A | 11/2003 |
| JP | 2006147235 A | 6/2006 |
| JP | 2007-023304 A | 2/2007 |
| JP | 2008019478 A | 1/2008 |
| JP | 2008-235165 A | 10/2008 |
| JP | 2009-023331 A | 2/2009 |

OTHER PUBLICATIONS

First Office Action issued Feb. 16, 2013 in Chinese Patent Application No. 201080048041.8 to Sumitomo Chemical Co., Ltd., with English translation.

Chinese Office Action issued Sep. 17, 2013 in Chinese Patent Application No. 201080048041.8

European Search Report issued Oct. 11, 2013, European Patent Application No. 10826894.7.

Japanese Patent Office, "Notice of Reasons for Rejection," issued in connection with Japanese Patent Application No. 2010-243445, dated May 7, 2014.

State Intellectual Property Office of People's Republic of China, "The 4th Office Action," issued in connection with Chinese Patent Application No. 201080048041.8, dated Jul. 31, 2014.

State Intellectual Property Office of People's Republic of China, "The Third Office Action" issued in connection with Chinese Patent Application No. 201080048041.8, dated Mar. 26, 2014.

Taiwanese Patent Office, "Office Action of the Intellectual Property Office," issued in connection with Taiwanese Patent Application No. 099137018, dated Jul. 30, 2014.

State Intellectual Property Office of People's Republic of China, "Rejection Decision," Issued in connection with Chinese Patent Application No. 201080048041.8, dated Feb. 9, 2015.

* cited by examiner

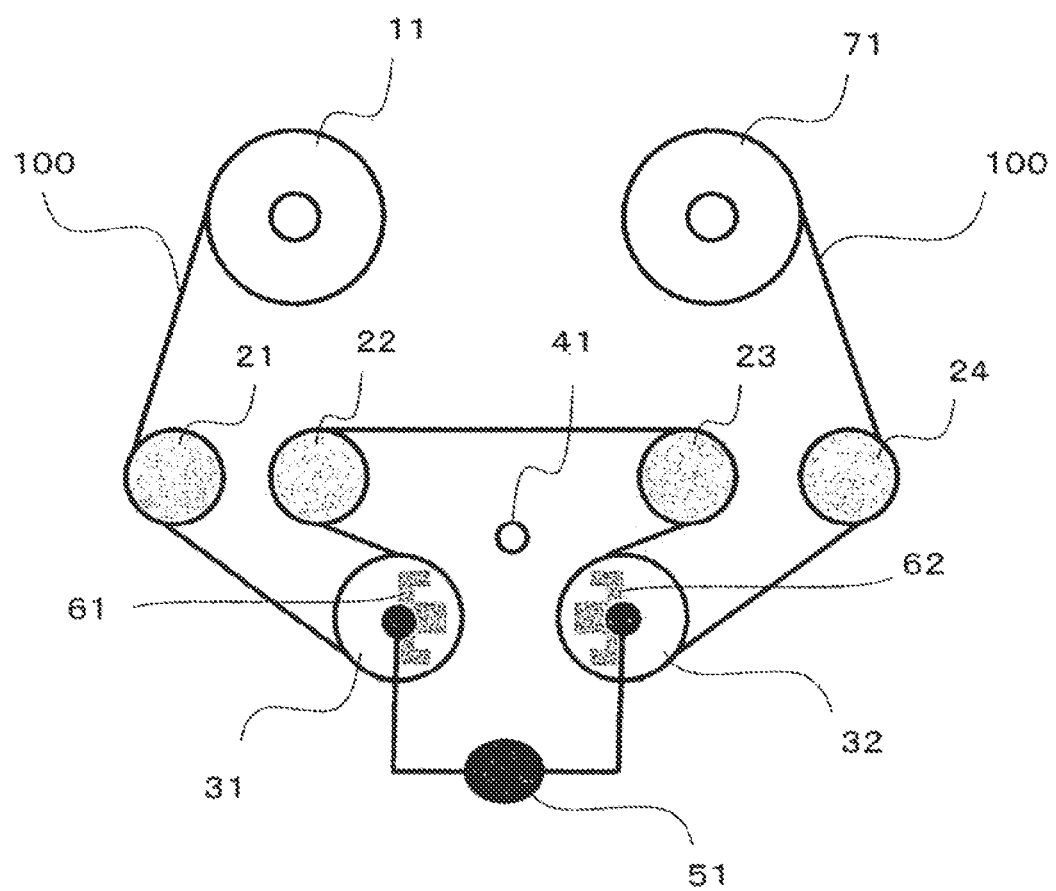

METHOD OF MANUFACTURE OF MULTILAYER FILM

CROSS REFERENCE TO RELATED APPLICATIONS

This application is a National Stage of International Application No. PCT/JP2010/069394, filed on Oct. 26, 2010, which claims priority from Japanese Patent Application No. 2009-250310, filed on Oct. 30, 2009, the contents of all of which are incorporated herein by reference in their entirety.

TECHNICAL FIELD

The present invention relates to a method of manufacturing a multilayer film by forming a barrier film and a transparent conductive film on a resin film.

BACKGROUND ART

In recent years, organic EL devices have drawn attention as self-emitting devices. An organic EL element is an element which has a configuration wherein a light-emitting layer of an organic compound is interposed between electrodes on a substrate, and which emits light when current is supplied between the electrodes. As the light-emitting layer is an organic compound, it is possible to fabricate a flexible organic EL element by using a resin film as the substrate, but as the light-emitting element and the cathode are easily degraded by oxygen and moisture, it is necessary to provide a barrier film on the resin film to block as much as possible the oxygen and moisture that infiltrate via the resin film.

As a member of an organic EL element like the one mentioned above, various studies have been made with respect to a multilayer film which uses a resin film as the substrate, and which has a barrier film, and a transparent conductive film that constitutes one of the electrodes. As a method of forming a barrier film, studies are ongoing with respect to the electron beam method, sputtering method, plasma CVD method, ion plating method and so on; as a method of forming a transparent conductive film, studies are ongoing with respect to physical vapor deposition (PVD) methods such as sputtering and ion plating (see, e.g., JP-A-2008-235165 (paragraph 0002, paragraph 0050)). However, with respect to the aforementioned conventional multilayer film, there is a problem that barrier properties and electrical conductivity tend to decline when bending occurs. Otherwise, it should be noted that CVD is the abbreviation for "chemical vapor deposition."

DISCLOSURE OF THE INVENTION

The object of the present invention is to offer a method capable of manufacturing a multilayer film which uses a resin film as a substrate and which has a barrier film and a transparent conductive film, and the multilayer film, even when bent, inhibits degradation of barrier properties and electrical conductivity.

As a result of diligent study, the present inventors discovered that it is possible to achieve the aforementioned objectives by adopting a specific plasma CVD method as the method of formation of the barrier film, thereby perfecting the present invention.

That is, the present invention offers a method of manufacturing a multilayer film by forming a barrier film and a transparent conductive film on a resin film, wherein the aforementioned barrier film is formed by a plasma enhanced CVD method which uses electric discharge between rolls.

BRIEF DESCRIPTION OF THE DRAWINGS

FIG. 1 is a schematic view which shows one example of an apparatus suited to formation of a barrier film by a plasma enhanced CVD method which uses electric discharge between rolls. In this drawing, reference numeral 11 indicates a feed roll. 21, 22, 23, and 24 respectively indicate conveyance rolls. 31 and 32 respectively indicate film forming rolls. 41 indicates a gas supply pipe, and 51 indicates a plasma generator. 61 and 62 respectively indicate magnetic field generators. 71 indicates a take-up roll and 100 indicates a resin film.

MODE FOR CARRYING OUT THE INVENTION

With respect to the resin film constituting the substrate of the multilayer film, a colorless and transparent film is satisfactory. Examples of the resin composing the resin film include polyester resins such as polyethylene terephthalate (PET) and polyethylene naphthalate (PEN); polyolefin resins such as polyethylene (PE), polypropylene (PP), and cyclic polyolefin; polyamide resin; polycarbonate resin; polystyrene resin; polyvinyl alcohol resin; saponification product of ethylene-acetate vinyl copolymer; polyacrylonitrile resin; acetal resin; polyimide resin; and polyether sulfide (PES). Two or more of these may be combined as necessary. In conjunction with required characteristics such as transparency, heat resistance properties, and linear expansion properties, selection from polyester resins and polyolefin resins is preferable, and PET, PEN, and cyclic polyolefin are more preferable.

The thickness of the resin film may be appropriately set taking into consideration stability and the like at the time of manufacture of the multilayer film, but 5-500 μm is preferable, because conveyance of the resin film even in a vacuum is facilitated. Furthermore, as electric discharge is conducted through the resin film when forming the barrier film by the plasma enhanced CVD method which uses electric discharge between rolls that is adopted by the present invention, the thickness of the resin film is more preferably 50-200 μm, and still more preferably 50-100 μm.

From the viewpoint of adhesion with the barrier film, surface active treatment may be conducted on the resin film in order to clean its surface. Examples of surface active treatment include corona treatment, plasma treatment, and flame treatment.

In the present invention, a plasma enhanced CVD method which uses electric discharge between rolls is employed as the method of forming the barrier film on the resin film. By this means, it is possible to obtain multilayer film which inhibits degradation of barrier properties even when bent. When a conventional multilayer film is bent, cracking tends to occur in the barrier film, and barrier properties tend to deteriorate, but according to the present invention, it is possible to obtain a multilayer film which inhibits cracking of barrier film and degradation of barrier properties even when bent.

Here, the CVD method is one of the methods for forming a thin film on the surface of a substance. The plasma CVD method is one such method, and is a film forming method which radicalizes and/or ionizes a raw material substance, and which deposits the raw material substance on a substrate such as a resin film by conducting plasmafication of gas containing the raw material substance by alternating current. With respect to this plasma CVD method, a low-pressure plasma CVD method is preferable. Here, low pressure is ordinarily 0.1-10 Pa with respect to pressure in the discharge space region where the discharge gas is excited, and pressure in the region where a thin film is formed by contact between the excited discharge gas and the gas that forms the thin film. With the plasma enhanced CVD method that uses electric discharge between rolls, plasma discharge occurs in the space between multiple film forming rolls.

As a typical example of a plasma enhanced CVD method which uses electric discharge between rolls, two water-cooled rotary drums incorporating non-rotating magnets are set up at an interval of 4-5 cm. A magnetic field is formed between these two rolls, and an intermediate frequency is applied between the magnet and the roller. Extremely bright, high-density plasma forms between the two rolls when gas is introduced. Electrons are confined near the center of the gap by the magnetic field and electric field between these rolls, forming high-density plasma (density>$10^{12}/cm^3$).

This plasma source can be actuated with low pressure in the neighborhood of several Pa, and the temperature of neutral particles and ions is low, near room temperature. On the other hand, as the temperature of the electrons is high, radicals and ions are generated in abundance. In addition, the action of the magnetic field prevents high-temperature secondary electrons from flowing into the resin film. Consequently, high electric power can be inputted while keeping the temperature of the resin film low, achieving high-speed film formation. As film deposition occurs for the most part only on the surface of the resin film, and as the electrodes are covered by the resin film and are not easily contaminated, stable film formation can be conducted over long periods.

Here, according to the low-pressure system, the gas phase reaction of the CVD method—i.e., generation of particles—can be prevented. Moreover, as the transparent conductive film formation, which is the next step, is a physical film forming method which also requires a low-pressure environment, there is little pressure difference in film formation environments between the film formation process of the barrier film and the film formation process of the transparent conductive film. That is, compared with the conventional method which forms a barrier film in a high-pressure environment, there is no need for a device to adjust pressure, and equipment costs can be greatly reduced.

The barrier film preferably contains silicon, oxygen, and carbon, and additional inclusion of nitrogen is also preferable. The respective concentrations of the silicon, oxygen, and carbon in the barrier film may be fixed, but it is also acceptable if, for example, the concentrations of carbon and oxygen vary relative to the direction of film thickness. These element concentrations may be measured by an XPS analyzer.

The thickness of the barrier film is appropriately selected, given that optimal conditions will vary according to the type and configuration of the employed material, but 1-5000 nm is preferable. When the barrier film is excessively thin, a uniform film is unobtainable, and it is difficult to obtain a high level of barrier properties relative to gas such as moisture; and when the barrier film is excessively thick, it is difficult to preserve the flexibility of the resin film. Moreover, for configurations where the optical information of electrical devices is transmitted, the barrier film preferably has transparency with little optical loss.

The physical vapor deposition (PVD) method is preferably used as the method of forming the transparent conductive film on the resin film, because it obtains a transparent conductive film of low resistance. Examples thereof include vacuum vapor deposition, electron beam vapor deposition, sputtering, ion plating, and laser abrasion (pulse laser deposition (PLD)). Ion plating and sputtering are preferable from such viewpoints as film formation speed, width of film formation area, uniformity of film formation surface, and etching properties. With respect to ion plating, ion plating which uses a pressure-gradient plasma gun (referred to as an "Uramoto gun") is preferable, because of inhibition of conductivity degradation even when bending occurs, high film formation speed, and long life due to non-exposure of the cathode to the gas atmosphere, and because it enables continuous conduct of stable film formation over long periods.

It is preferable that the transparent conductive film include at least one element selected from the group consisting of indium (In), tin (Sn), zinc (Zn), and titanium (Ti). In particular, it is preferable to use a film with at least one oxide selected from the group consisting of indium-tin oxide (ITO), zinc-tin oxide (ZTO), indium-zinc oxide (IZO), indium-gallium oxide (IGO), indium-zinc-tin oxide (IZTO), indium-gallium-zinc oxide (IGZO), aluminum-doped zinc oxide (AZO), gallium-doped zinc oxide (GZO), antimony-doped tin oxide (ATO), fluorine-doped tin oxide (FTO), niobium-doped titanium oxide (NTO), tantalum-doped titanium oxide (TTO), and vanadium-doped titanium oxide (VTO).

With respect to formation of a barrier film and a transparent conductive film on the resin film, the laminar configuration of the obtained multilayer film may be appropriately set according to application and the like: for example, the barrier film may be formed on the surface of one side of the resin film, and then the transparent conductive film may be formed on the barrier film; or the barrier film may be formed on the surface of one side of the resin film, and then the transparent conductive film may be formed on the surface of the other side; or the transparent conductive film may be formed on the surface of one side of the resin film, and then the barrier film may be formed on the surface of the other side; or the barrier film may be formed on both surfaces of the resin film, and then the transparent conductive film may be formed on the barrier film of one side. In particular, the multilayer film manufacturing method of the present invention may be advantageously adopted in the case of manufacture of a multilayer film having a laminar configuration of the transparent conductive film/the barrier film/the resin film, where the barrier film is formed on the surface of one side of the resin film, and then the transparent conductive film is formed on the barrier film.

In the case where the transparent conductive film is formed on barrier film after forming the barrier film on the surface of one side of the resin film, the following modes (1)-(3) can be specifically adopted.

(1) A barrier film is formed while unwinding and continuously conveying roll-shaped resin film, and the obtained film with barrier film is wound into a roll.

Subsequently, this roll-shaped film with the barrier film is unwound, and cut into sheets, and then a transparent conductive film is formed to obtain the multilayer film. This mode conducts formation of barrier film on a roll-to-roll basis, and conducts formation of the transparent conductive film in sheets.

(2) A barrier film is formed while unwinding and continuously conveying a roll-shaped resin film, and the obtained film with the barrier film is wound into a roll. Subsequently, a transparent conductive film is formed while unwinding and continuously conveying this roll-shaped film with barrier film, and the multilayer film is obtained, and wound into a roll. This mode continuously conducts both formation of the barrier film and formation of the transparent conductive film on a roll-to-roll basis.

(3) While unwinding and continuously conveying the resin film from the roll-shaped resin film, a barrier film is formed, and then a transparent conductive film is formed, and the obtained multilayer film is wound into a roll. This mode continuously conducts formation of the barrier film and formation of the transparent conductive film in combination on a roll-to-roll basis.

Prior to formation of the transparent conductive film, other layers may be formed on the barrier film as necessary. For example, as proposed in Patent Document 1, a planarization film may be formed. In the present invention, the transparent conductive film is formed directly without formation of other layers on the transparent conductive film, which is preferable from the viewpoint of reducing equipment costs.

FIG. 1 is a schematic view which shows an example of an apparatus suited to the case where barrier film formation is conducted on a roll-to-roll basis by a plasma enhanced CVD method which uses electric discharge between rolls, as in the aforementioned mode (1) or (2). This apparatus is provided with a feed roll 11, conveyance rolls 21, 22, 23 and 24, film forming rolls 31 and 32, a gas supply pipe 41, a plasma generator 51, magnetic field generators 61 and 62, and a take-up roll 71. In this apparatus, at least the film forming rolls 31 and 32, gas supply pipe 41, plasma generator 51, and magnetic field generators 61 and 62 are disposed within a vacuum chamber, and pressure within the vacuum chamber is adjustable. Furthermore, in this apparatus, plasma can be generated in the space between the film forming roll 31 and the film forming roll 32 by the plasma power source 51. Moreover, in this apparatus, the magnetic field generators 61 and 62 are respectively provided in the film forming rolls 31 and 32 so that fixed positional relations are maintained relative to the space between the film forming roll 31 and the film forming roll 32 even when the rolls rotate. According to this apparatus, it is possible to efficiently form a barrier film on the surface of a resin film 100, because barrier film components can be deposited on the surface of the resin film 100 on the film forming roll 31, and the barrier film components can be additionally deposited on the film forming roll 32.

Known rolls can be suitably used as the feed roll 11 and the conveyance rolls 21, 22, 23, 24, and known rolls can also be suitably used as the take-up roll 71. Furthermore, known rolls can be suitably used as the film forming rolls 31 and 32, and the diameter of the film forming rolls 31 and 32 is preferably 5-100 cm. As the gas supply pipe 41, a pipe can be suitably used which enables supply or discharge of raw material gas and the like at a prescribed speed. Furthermore, as the plasma generator 51, a conventional plasma generator can be suitably used. As the magnetic field generators 61 and 62, conventional magnetic field generators can be suitably used. Furthermore, as the resin film 100, a film on which a barrier film has been formed in advance can be used. In this manner, it is possible to thicken the thickness of the barrier film by using the film on which the barrier film has been preformed as the resin film 100.

Using this apparatus, a barrier film can be formed on the resin film 100 by suitably adjusting, for example, the type of raw material gas, the power of the electrode drum of the plasma generator, the pressure within the vacuum chamber, the diameter of the film forming rolls, and the conveyance speed of the film. That is, by generating plasma discharge while supplying film formation gas such as raw material gas to the interior of the vacuum chamber, the aforementioned raw material gas is decomposed by the plasma, forming the barrier film by the plasma CVD method on the surface of the resin film 100. A barrier film is then formed on the surface of the resin film 100 in a roll-to-roll system by having the film forming rolls 31 and 32 respectively convey the resin film 100.

The raw material gas may be appropriately selected for use according to the material of the barrier film to be formed. As the raw material gas, for example, an organic silicon compound containing silicon can be used. Examples of such organic silicon compounds include hexamethyl disiloxane, 1,1,3,3-tetramethyl disiloxane, vinyl trimethyl silane, methyl trimethyl silane, hexamethyl disilane, methyl silane, dimethyl silane, trimethyl silane, diethyl silane, propyl silane, phenyl silane, vinyl triethoxy silane, vinyl trimethoxy silane, tetramethoxy silane, tetraethoxy silane, phenyl trimethoxy silane, methyl triethoxy silane, octamethyl cyclotetrasiloxane, dimethyl disilazane, trimethyl disilazane, tetramethyl disilazane, pentamethyl disilazane, and hexamethyl disilazane. Among these organic silicon compounds, from such viewpoints as handling of the compound and gas barrier properties of the obtained barrier film, hexamethyl disiloxane and 1,1,3,3-tetramethyl disiloxane are preferable. Moreover, these organic silicon compounds may be used alone or in combinations of two or more.

As the aforementioned film formation gas, in addition to the aforementioned raw material gas, reaction gas may also be used. As such reaction gas, gas that reacts with the aforementioned raw material gas to become inorganic compounds such as oxides and nitrides may be appropriately selected for use. As reaction gas that serves to form oxides, for example, oxygen or ozone may be used. As reaction gas that serves to form nitrides, for example, nitrogen or ammonia can be used. These reaction gases may be used alone or in combinations of two or more. In the case where, for example, oxynitrides are formed, reaction gas that serves to form oxides and reaction gas that serves to form nitrides can be used in combination.

As the aforementioned film formation gas, carrier gas may also be used as necessary in order to supply the aforementioned raw material gas to the interior the vacuum chamber. Furthermore, as the aforementioned film formation gas, gas for electric discharge may also be used as necessary in order to generate plasma discharge. As such carrier gas and discharge gas, known gases can be suitably used, e.g., hydrogen and rare gases such as helium, argon, neon, and xenon can be used.

The degree of vacuum within the pertinent vacuum chamber expressed by pressure within the vacuum chamber may be suitably adjusted according to the type of raw material gas and the like, but 0.5-50 Pa is preferable. Moreover, the power of the electrode drum of the plasma generator may be suitably adjusted according to the type of raw material gas, pressure within the vacuum chamber, and the like, but 0.1-10 kW is preferable.

The conveyance speed (line speed) of the resin film 100 can be suitably adjusted according to the type of raw material gas, pressure within the vacuum chamber, and the like, but 0.25-100 m/min is preferable, and 0.5-20 m/min is more preferable. At line speeds below the aforementioned minimums, heat-derived flaws tend to occur in the film, and when, conversely, the aforementioned maximums are exceeded, the thickness of the barrier film that is formed tends to thin.

The multilayer film obtained by the manufacturing method of the present invention described above uses the resin film as the substrate, and can be used as a member in flexible products. In addition, as it has the barrier film and the transparent conductive film, and as it inhibits degradation of barrier properties and conductivity even when bent, it may be suitably used as a member in various types of products that require flexibility as well as barrier properties and conductivity, including organic EL devices.

EXAMPLES

Examples of the present invention are shown below. The examples shown below are preferred exemplifications that serve to describe the present invention, and the present invention is not limited thereto.

Example 1

Formation of Barrier Film

Using the manufacturing apparatus shown in FIG. 1, a barrier film was formed on resin film. That is, first, a roll of resin film 100 constituting the substrate (biaxially-oriented polyethylene naphthalate film (PEN film) with a thickness of 100 μm and a width of 350 mm, manufactured by Teijin Dupont Films Japan Co.; brand name "Teonex Q65FA") was attached to the feed roll 11. The resin film 100 unwound from the pertinent roll sequentially passed through the conveyance roll 21, the film forming roll 31, the conveyance rolls 22 and 23, the film forming roll 32, and the conveyance roll 24, and was then taken up by the take-up roll 71. During conveyance of the resin film 100, a magnetic field was applied between the film forming roll 31 and the film forming roll 32, electric power was supplied to both the film forming roll 31 and the film forming roll 32, plasma was generated by electric discharge between the film forming roll 31 and the film forming roll 32, film formation gas (a mixed gas composed of hexamethyl disiloxane (HMDSO) as the raw material gas and oxygen gas as the reaction gas (also functioning as the discharge gas)) was supplied to this discharge region, and thin-film formation was conducted by the plasma CVD method under the following conditions to obtain a multilayer film A in which a barrier film was formed on the resin film 100.

(Film Formation Conditions)
Supply amount of raw material gas: 50 sccm (standard cubic centimeter per minute) (0° C., 1 atmospheric pressure standard)
Supply amount of oxygen gas: 500 sccm (0° C., 1 atmospheric pressure standard)
Degree of vacuum in vacuum chamber: 3 Pa
Applied power from plasma generating power source: 0.8 kW
Frequency of plasma generating power source: 70 kHz
Conveyance speed of film: 0.5 m/min The thickness of the obtained barrier film was 370 nm. With respect to the obtained multilayer film A, water vapor transmittance was $3.1 \times 10^{-4}$ g/(m$^2$·day) under conditions where temperature was 40° C., humidity on the low humidity side was 0% RH, and humidity on the high humidity side was 90% RH, and water vapor transmittance was a value below the detection threshold (0.02 g/(m$^2$·day)) under conditions where temperature was 40° C., humidity on the low humidity side was 10% RH, and humidity on the high humidity side was 100% RH. Furthermore, after bending under the condition of a curvature radius of 8 mm, water vapor transmittance was a value below the detection threshold under conditions where temperature was 40° C., humidity on the low humidity side was 10% RH, and humidity on the high humidity side was 100% RH, thereby confirming that reduction of gas barrier properties could be fully inhibited even when the obtained multilayer film A was bent.

With respect to the obtained multilayer film A, XPS depth profile measurement was conducted under the following conditions to investigate composition distribution.

Etching ion type: argon (Ar$^+$)
Etching rate (SiO$_2$ thermal oxide film conversion value): 0.05 nm/sec
Etching interval (SiO$_2$ conversion value): 10 nm
X-ray photoelectron spectrometer: manufactured by Thermo Fisher Scientific Co., model name "VG Theta Probe"
Irradiating X-rays: single crystal spectroscopy AlKα
Form and size of X-ray spot: ellipse with a major diameter of 800 μm and a minor diameter of 400 μm From the composition distribution of XPS depth profile measurement, it could be confirmed that the aforementioned barrier film was film with a composition including silicon, oxygen, and carbon.

Form of Transparent Conductive Film

Using ITO (In:Sn=95:5; high-density product with purity of 99.99% and particle size of 3-5 mm) manufactured by Myojo Kinzoku Co. as the target, transparent conductive film was formed on the barrier film of the aforementioned multilayer film A under the following film formation conditions by an ion plating film formation apparatus with a pressure-gradient plasma gun (manufactured by Chugai Ro Co., Ltd.: SUPLaDUO, CVP-4111) to obtain a multilayer film B.

(Film Formation Conditions)
Discharge power: 5.0 kW
Substrate temperature: room temperature
Ar gas flow rate: 20 sccm (0° C., 1 atmospheric pressure standard)
O$_2$ gas flow rate: 13.7 sccm (0° C., 1 atmospheric pressure standard)
Film formation pressure: 0.06 Pa
Pre-discharge time: 180 s
Film formation time: 62 s When obtained by TEM (transmission electron microscope image) using FIB (focused ion beams), the thickness of the transparent conductive film was 150 nm. With respect to the obtained multilayer film B, when total light transmittance and haze were measured using haze meter (manufactured by Shiga Test Equipment Co.: HGM-2DP), total light transmittance was 80.8% and haze was 0.6%. The sheet resistance of the transparent conductive film obtained using a resistivity meter (manufactured by Mitsubishi Chemical Corporation: Loresta-GP, MCP-T610) was 42.7 Ω/sq, and specific resistance was $6.4 \times 10^{-4}$ Ωcm. Furthermore, the surface roughness Ra of the transparent conductive film measured using an atomic force microscope AFM (manufactured by SII: SPI3800N) was 2.34 nm.

Example 2

Using the multilayer film A obtained in Example 1, a transparent conductive film was formed under the following film formation conditions on the barrier film of the multilayer film A by an ion plating film formation apparatus with a pressure-gradient plasma gun (manufactured by Chugai Ro Co., Ltd.: SUPLaDUO, CVP-4111) using ITO (In:Sn=95:5; high-density product with purity of 99.99% and particle size of 3-5 mm) manufactured by Myojo Kinzoku Co. as the target, and a multilayer film C was obtained.

(Film Formation Conditions)
Discharge power: 5.0 kW
Substrate temperature: 180° C.
Ar gas flow rate: 20 sccm (0° C., 1 atmospheric pressure standard)
O$_2$ gas flow rate: 13.7 sccm (0° C., 1 atmospheric pressure standard)
Film formation pressure: 0.06 Pa
Pre-discharge time: 180 s Film formation time: 62 s The thickness of the transparent conductive film, the total light transmittance and haze of the multilayer film C, the sheet resistance and specific resistance of the transparent conductive film, and the surface roughness of the transparent conductive film, which were measured in the same manner as Example 1, were respectively 100 nm, 81.2% and 0.6%, 18 Ω/sq and $1.8 \times 10^{-4}$ Ωcm, and 2.37 nm.

Example 3

Using the multilayer film A obtained in Example 1, a transparent conductive film was formed under the following film formation conditions on the barrier film of the multilayer film A by an ion plating film formation apparatus with a pressure-gradient plasma gun (manufactured by Chugai Ro Co., Ltd.: SUPLaDUO, CVP-4111) using ZTO (Zn2SnO4, zinc-tin oxide) as the target, and a multilayer film D was obtained.

As the ZTO target, zinc oxide powder (4N, manufactured by Kojundo Chemical Laboratory Co.) and tin oxide powder (4N, manufactured by Kojundo Chemical Laboratory Co.) were weighed out to obtain zinc:tin=2:1 (mol ratio), mixing and sintering were conducted to obtain a sintered body, and this was pulverized to a particle size of approximately 3-5 mm for use as the target of ion plating.

(Film Formation Conditions)
Discharge power: 11.2 kW
Substrate heating temperature: room temperature
Ar gas flow rate: 20 sccm (0° C., 1 atmospheric pressure standard)
$O_2$ gas flow rate: 0 sccm (0° C., 1 atmospheric pressure standard)
Film formation pressure: 0.06 Pa
Pre-discharge time: 26 s
Film formation time: 33 s The thickness of the transparent conductive film, the total light transmittance and haze of the multilayer film D, the sheet resistance and specific resistance of the transparent conductive film, and the surface roughness of the transparent conductive film, which were measured in the same manner as Example 1, were respectively 100 nm, 81.2% and 0.6%, 65 Ω/sq and $6.5 \times 10^{-3}$ Ωcm, and 1.93 nm.

Example 4

Using the multilayer film A obtained in Example 1, a transparent conductive film was formed under the following film formation conditions on the barrier film of the multilayer film A by an ion plating film formation apparatus with a pressure-gradient plasma gun (manufactured by Chugai Ro Co., Ltd.: SUPLaDUO, CVP-4111) using ZTO (Zn2SnO4, zinc-tin oxide) as the target, and a multilayer film E was obtained.

As the ZTO target, zinc oxide powder (4N, manufactured by Kojundo Chemical Laboratory Co.) and tin oxide powder (4N, manufactured by Kojundo Chemical Laboratory Co.) were weighed out to obtain zinc:tin=2:1 (mol ratio), mixing and sintering were conducted to obtain a sintered body, and this was pulverized to a particle size of approximately 3-5 mm for use as the target of ion plating.

(Film Formation Conditions)
Discharge power: 11.2 kW
Substrate heating temperature: 180° C.
Ar gas flow rate: 20 sccm (0° C., 1 atmospheric pressure standard)
$O_2$ gas flow rate: 0 sccm (0° C., 1 atmospheric pressure standard)
Film formation pressure: 0.06 Pa
Pre-discharge time: 26 s
Film formation time: 33 s The thickness of the transparent conductive film, the total light transmittance and haze of the multilayer film E, the sheet resistance and specific resistance of the transparent conductive film, and the surface roughness of the transparent conductive film, which were measured in the same manner as Example 1, were respectively 100 nm, 82.3% and 0.7%, 40 Ω/sq and $4.0 \times 10^{-3}$ Ωcm, and 1.92 nm.

Comparative Example

Instead of film formation by the plasma CVD method of Example 1, formation of a silicon oxide film was conducted on the substrate (PEN film) used in Example 1 by the reactive sputtering method using silicon as the target, and a multilayer film F was obtained. When XPS depth profile measurement of the silicon oxide film was conducted in the same manner as Example 1, it was confirmed that the silicon oxide film was film containing silicon and oxygen, but not containing carbon.

The thickness of the obtained silicon oxide film was 100 nm. With respect to the obtained multilayer film F, the barrier properties of the silicon oxide film could not be confirmed, because water vapor transmittance was 1.3 g/($m^2$·day) under conditions where temperature was 40° C., humidity on the low humidity side was 10% RH, and humidity on the high humidity side was 100% RH, which was identical to the 1.3 g/($m^2$·day) water vapor transmittance of the PEN substrate.

Using the obtained multilayer film F, a transparent conductive film was formed on the silicon oxide film of the multilayer film F by the sputtering method using ITO, and a multilayer film G was obtained.

The thickness of the transparent conductive film obtained in the same manner as Example 1 was 150 nm, and transmittance of visible light was 79%. The obtained multilayer film G had poor barrier properties, and was unsuitable as a flexible substrate for organic ELs and the like.

Industrial Applicability

According to the present invention, with respect to a multilayer film which uses a resin film as a substrate and which has a barrier film and a transparent conductive film, it is possible to obtain a multilayer film which inhibits degradation of barrier properties and conductivity even when bent.

The invention claimed is:
1. A method comprising:
manufacturing a multilayer film by forming a barrier film containing silicon, oxygen, and carbon and a transparent conductive film on a resin film, wherein said barrier film is formed by a plasma enhanced CVD method which uses electric discharge between two rolls in which two magnets are provided respectively under a pressure of 0.1 Pa to 10 Pa in a condition where an intermediate frequency is applied between the rolls where a magnetic field is formed, and an organic silicon compound and oxygen are introduced as film formation gas to the rolls where the intermediate frequency is applied to form high-density plasma between the rolls wherein the two rolls each contain therein one of the two magnets.
2. The method of manufacturing a multilayer film according to claim 1, wherein said resin film is a polyester resin film or a polyolefin resin film.

3. The method of manufacturing a multilayer film according to claim 1, wherein said transparent conductive film is formed by a physical vapor deposition method.

4. The method of manufacturing a multilayer film according to claim 3, wherein said physical vapor deposition method is an ion plating method.

5. The method of manufacturing a multilayer film according to claim 4, wherein said ion plating method is an ion plating method which uses a pressure-gradient plasma gun.

6. The method of manufacturing a multilayer film according to claim 3, wherein said physical vapor deposition method is a sputtering method.

7. The method of manufacturing a multilayer film according to claim 1, wherein said transparent conductive film is film containing at least one element selected from the group consisting of indium, tin, zinc, and titanium.

8. The method of manufacturing a multilayer film according to claim 1, wherein said transparent conductive film is film of at least one oxide selected from the group consisting of indium-tin oxide, zinc-tin oxide, indium-zinc oxide, indium-gallium oxide, indium-zinc-tin oxide, indium-gallium-zinc oxide, aluminum-doped zinc oxide, gallium-doped zinc oxide, antimony-doped tin oxide, fluorine-doped tin oxide, niobium-doped titanium oxide (NTO), tantalum-doped titanium oxide (TTO), and vanadium-doped titanium oxide (VTO).

9. The method of manufacturing a multilayer film according to claim 1, wherein said barrier film is formed on said resin film, and then said transparent conductive film is formed on said barrier film.

10. The method of manufacturing a multilayer film according to claim 9, wherein said transparent conductive film is formed directly on said barrier film.

* * * * *